United States Patent [19]
Hoshi et al.

[11] Patent Number: 5,629,902
[45] Date of Patent: May 13, 1997

[54] SEMICONDUCTOR MEMORY DEVICE

[75] Inventors: Satoru Hoshi, Kawasaki; Masami Masuda, Yokohama, both of Japan

[73] Assignee: Kabushiki Kaisha Toshiba, Tokyo, Japan

[21] Appl. No.: 364,164

[22] Filed: Dec. 27, 1994

[30] Foreign Application Priority Data

Dec. 28, 1993 [JP] Japan ................... 5-337489

[51] Int. Cl.$^6$ ........................ G11C 7/00
[52] U.S. Cl. ................... 365/233; 365/230.03
[58] Field of Search ............... 365/233, 230.03, 365/233.5, 203

[56] References Cited

U.S. PATENT DOCUMENTS

| | | | |
|---|---|---|---|
| 5,289,408 | 2/1994 | Mimura | 365/230.03 |
| 5,402,390 | 3/1995 | Ho | 365/233 |
| 5,414,672 | 5/1995 | Ozeki | 365/233 |
| 5,477,491 | 12/1995 | Shirai | 365/233 |

*Primary Examiner*—A. Zarabian
*Attorney, Agent, or Firm*—Loeb & Loeb LLP

[57] ABSTRACT

In an asynchronous type memory device for controlling a plurality of bytes independently, even if the byte control signal changes in the write cycle, the automatic power-down can be released and further the data can be read after data have been written. When data are transferred from the input/output terminals I/OUBm and I/OLBn to the internal data buses DbusUB and DbusLB through the upper byte data input buffers DinUBm and the lower byte input buffers DinLBn, the change detecting sections UWTD and LWTD generate the write start synchronous pulse $\phi$BWS and the write end synchronous pulse $\phi$BWE on the basis of the logical result of the write request signal /WE and the control signal /UB or /LB. Therefore, when the data are written and read for each byte independently, data can be written in and read from the memory cells irrespective of the data conditions. Further, the written data can be read immediately without changing the addresses.

25 Claims, 11 Drawing Sheets

SEMICONDUCTOR MEMORY DEVICE

FIELD OF THE INVENTION

The present invention relates to a semiconductor memory device, and more specifically to a semiconductor memory device suitable for use as an asynchronous static memory having two or more data input/output buses to write data in unit of byte.

BACKGROUND OF THE INVENTION

Recently, with the an improvement of CPU functions, systems having a wide data bus or buses have been used more and more. Accordingly, the memory elements with data buses as wide as several bytes have been required. In addition, a read/write function in unit of byte has been also required for the memory elements.

FIG. 5 is a system diagram showing a conventional asynchronous semiconductor memory device having a two-byte data width, in which the data are handled as upper byte data and lower byte data.

In the input/output data, the upper byte data thereof are inputted and/or outputted through data input/output terminals I/OUB1 to I/OUB8 (referred to as I/OUBm, hereinafter). On the other hand, the lower byte data are inputted and/or outputted through data input/output terminals I/OLB1 to I/OLB8 (referred to as I/OLBn, hereinafter).

In the upper byte write operation, the data inputted through the data input/output terminals I/OUBm are outputted to an upper byte internal data bus DbusUB via upper byte data input buffers DinUBm. On the other hand, in the upper byte read operation, the data on the upper byte internal data bus DbusUB are outputted through the data input/output terminals I/OUBm via upper byte data output buffers DoutUBm.

In the lower byte write operation, the data inputted to the data input/output terminals I/OLBn are outputted to a lower byte internal data bus DbusLB via lower byte data input buffers DinLBm. On the other hand, in the lower byte read operation, the data on the lower byte internal data bus DbusLB are outputted through the data input/output terminals I/OLBn via lower byte data output buffers DoutLBn.

The upper byte data input buffers DinUBm and the upper byte data output buffers DoutUBm are connected to the internal data bus DbusUB. The upper byte data input buffers DinUBm are controlled by an upper byte write request signal WEUB. Further, the data inputted to the upper byte data input buffers DinUBm are outputted to the internal data bus DbusUB, except a stand-by status for power saving.

The lower byte data input buffers DinLBn and the lower byte data output buffers DoutLBn are connected to the internal data bus DbusLB. The lower byte data input buffers DinLBn are controlled by a lower byte write request signal WELB. Further, the data inputted to the lower byte data input buffers DinLBn are outputted to the internal bus DbusLB, except a stand-by status for power saving.

The memory element as shown in FIG. 5 is controlled on the basis of an upper byte control signal /UB, a lower byte control signal /LB and a write request signal /WE all applied externally. The upper byte control signal /UB is inputted via an upper byte control signal buffer UBbuffer. The lower byte control signal /LB is inputted via a lower byte control signal buffer LBbuffer. The write request signal /WE is inputted to the upper byte control signal buffer UBbuffer, the lower byte control signal buffer LBbuffer, and a write request signal detecting section WEdet.

The upper byte control signal buffer UBbuffer supplies upper byte write request signals WEUB and /WEUB to an internal memory. The lower byte control signal buffer LBbuffer supplies lower byte write request signals WELB and /WELB to the internal memory.

The write request signal detecting section WEdet supplies a write start synchronous pulse $\phi$WS and a write end synchronous pulse $\phi$WE to the internal memory.

The upper byte data input buffers DinUBm and the lower byte data input buffers DinLBn are activated on the basis of the upper byte write request signals WEUB and /WEUB and the lower byte write request signals WELB and /WELB. A data transition detecting circuit DTD monitors the statuses of data inputted to the upper byte data input buffers DinUBm and the lower byte data input buffers DinLBn through the data input/output terminals I/OUBm and I/OLBn, respectively. When the data inputted to the upper byte data input buffers DinUBm and the lower byte data input buffers DinLBn through the data input/output terminals I/OUBm and I/OLBn change, the data transition detecting circuit DTD detects the changes and then outputs a data transition pulse $\phi$DTD.

An address transition pulse $\phi$ATD of an address transition detecting circuit ATD, the data transition pulse $\phi$DTD of the data transition detecting circuit DTD, the write start synchronous pulse $\phi$WS and the write end synchronous pulse $\phi$WE of the write request signal detecting section WEdet are all inputted to an automatic power-down circuit APDbuffer. The automatic power-down circuit APDbuffer supplies an automatic power-down signal APD to the internal memory. When the statuses of data inputted to the upper byte data input buffers DinUBm and the lower byte data input buffers DinLBn through the data input/output terminals I/OUBm and I/OLBn do not change, after a predetermined time has elapsed, this power-down circuit APDbuffer reduces the power automatically, under control of the write start synchronous pulse WS and the data transition pulse $\phi$DTD, for power saving of the memory chip. On the other hand, an address transition pulse $\phi$ATD of an address transition detecting circuit ATD and the write end synchronous pulse $\phi$WE of the write request signal detecting section WEdet are inputted to an equalizer circuit EQbuffer. The equalizer circuit EQbuffer supplies an equalize/pull-up pulse $\phi$Eq to data lines in the memory device. The pulse $\phi$/Eq is supplied to gates of equalize transistors TUBEq and TLBEq for equalizing upper and lower byte data lines dUB, /dUB and dLB, /dLB.

In a section S designated by a memory address signal As, select cells ZUB corresponding to the upper byte and select cells ZLB corresponding to the lower byte are arranged. One of the two upper and lower byte select cells ZUB and ZLB can be selected by activating a word line WL.

The select cells ZUB are connected to the upper byte data lines dUB and/dUB via gates G controlled by column decode lines CD. On the other hand, the select cells ZLB are connected to the lower byte data lines dLB and/dLB via the gates G controlled by the column decode lines CD.

On the other hand, the upper byte data lines dUB and dUB are connected to a section write buffer SWBUB and a section read buffer SSAUB for transferring data to and from the internal data bus DbusUB. Further, the section write buffer SWUB and the section read buffer SSAUB are controlled on the basis of the upper byte write request signal WEUB and the automatic power-down signal APD, and the address signal As.

Further, the lower byte data lines dLB and/dLB are connected to a section write buffer SWLB and a section read buffer SSALB for transferring data to and from the internal data bus DbusLB. Further, the section write buffer SWBLB and the section read buffer SSALB are controlled on the basis of the lower byte write request signal WELB and the automatic power-down signal APD and the address signal As.

When the automatic power-down signal APD is at "L" level, the memory cells sets the section write buffer SWBUB and the section write buffer SWBLB to a stand-by status, respectively. Further, when there exists a change in data inputted to the upper byte data input buffers DinUBm and the lower byte data input buffers DinLBn through the data input/output terminals I/OUB and I/OLB, and thereby when the data transition detecting circuit DTD detects data change, the automatic power-down buffer APD buffer changes the automatic power-down signal from the "L" level to the "H" level by releasing the automatic power-down operation.

The operation of the memory device constructed as described above will be described hereinbelow with reference to the timing charts shown in FIG. 6. In FIG. 6, /WE denotes the write request signal /WE; /UB denotes the upper byte control signal /UB; /LB denotes the lower byte control signal /LB; WEUB denotes the upper byte write request signal WEUB; WELB denotes the lower byte write request signal WELB; /WEUB denotes the upper byte write request signal /WEUB; /WELB denotes the lower byte write request signal /WELB; $\phi$WS denotes the write start synchronous pulse $\phi$WS; I/OUBM denotes the status of the data input/output terminal I/OUBm; I/OLBn denotes the status of the data input/output terminal I/OLBn; $\phi$DTD denotes the data transition pulse $\phi$DTD; APD denotes the automatic power-down signal APD; DBusUB denotes the status of the internal data bus DbusUB; DBusLB denotes the states of the internal data bus DbusLB; DUB//dUB denotes the upper byte data lines dUB and /dUB; and dLB//dLB denotes the lower byte data lines dLB and /dLB.

First, at time t0, the assumption is made that the status of data applied to the data input/output terminals I/OUBm and the data input/output I/OLBn changes and further the write request signal /WE changes from the "H" level to the "L" level.

As a result, in response to the change of the write request signal /WE, the write request signal detecting section WEdet outputs the "H"-level write start synchronous pulse $\phi$WS for a predetermined time beginning at time t2.

On the other hand, at time t1 after time t0, the upper byte control signal /UB and the lower byte control signal /LB change from the "H" level to the "L" level.

As a result, in response to the changes of the upper byte control signal /UB and the write request signal /WE, the upper byte control buffer UBbuffer changes the upper byte write request signal WEUB from the "L" level to the "H" level at time t3 and the upper byte write request signal /WEUB from the "H" level to the "L" level also at time t3.

On the other hand, in response to the changes of the lower byte control signal /LB and the write request signal /WE, the lower byte control buffer LBbuffer changes the lower byte write request signal WELB from the "L" level to the "H" level at time t3 and the lower byte write request signal /WELB from the "H" level to the "L" level also at time t3.

As a result, in response to the upper byte write request signal /WEUB, the upper byte data input buffers DinUBm inputs the data applied through the data input/output terminals I/OUBm, and simultaneously outputs the inputted data to the upper byte internal data bus DbusUB at time t5 in response to the upper byte write request signal WEUB.

On the other hand, in response to the lower byte write request signal /WELB, the lower byte data input buffers DinLBm inputs the data applied through the data input/output terminals I/OLBm, and simultaneously outputs the inputted data to the lower byte internal data bus DbusLB at time t5 in response to the lower byte write request signal WELB.

Further, in response to the changes of data inputted to the upper byte data input buffers DinUBm and the lower byte data input buffers DinLBn, the data transition detecting circuit $\phi$DTD outputs the "H" level data transition pulse $\phi$DTD for a predetermined time beginning at time t4.

On the other hand, on the basis of any one of the data transition pulse $\phi$DTD from the data transition detecting circuit DTD and write start synchronous pulse $\phi$WS from the write request signal detecting section WEdet, the automatic power-down circuit APDbuffer keeps the automatic power-down signal APD at the "H" level for a predetermined time between time t6 and time t8 to keep the device activated until the write operation ends.

In response to a series of the above-mentioned operation, the automatic power-down of the section S selected by the address signal As is released. Further, through the section write buffer SWBUB of the section S activated by the upper byte write request signal WEUB, the statuses of the upper byte internal data bus DbusUB are given to the upper byte data lines dUB and /dUB at time t7. As a result, the statuses of the upper byte data lines dUB and /dUB are written in the selected memory cells ZUB via the gate G controlled by the column decode lines CD.

On the other hand, the automatic power-down of the section S selected by the address signal As is released. Further, through the section write buffer SWBLB of the section S activated by the lower byte write request signal WELB, the statuses of the lower byte internal data bus DbusLB are given to the lower byte data lines dLB and /dLB at time t7. As a result, the statuses of the lower byte data lines dLB and/dLB are written in the selected memory cells ZLB via the gate G controlled by the column decode lines CD.

After that, at time t9, when data inputted through the data input/output terminals I/OLBn change, new data are outputted to the lower byte internal data bus DbusLB via the lower byte data input buffers DinLBn. Simultaneously, in response to the change of the data inputted to the lower byte data input buffers DinLBn, the data transition detecting circuit DTD outputs the "H" level data transition pulse $\phi$DTD for a predetermined time beginning at time t10. In response to the data transition pulse $\phi$DTD, the automatic power-down circuit APDbuffer already set to the automatic power-down status keeps again the automatic power-down signal APD at the "H" level for a predetermined time between time t12 and time t16. On the basis of these operation, the automatic power-down of the section S selected by the address signal As is released. Further, through the section write buffer SWBLB of the section S activated by the lower byte write request signal WELB, the new data on the lower byte internal data bus DbusLB are given to the lower byte data lines dLB and /dLB at time t13. As a result, the statuses of the lower byte data lines dLB and /dLB are written in the selected memory cells ZLB via the gate G controlled by the column decode lines CD.

Further, when the upper byte control signal /UB is set to non-selection at time t14, the upper byte write request signal WEUB changes to the "L" level at time t15, and the upper byte write request signal /WEUB changes to the "H" level at time t15, so that both the signals are disabled. As a result, the section write buffer SWBUB changes to the stand-by status. At the same time, the operation of the initial stage is disabled by the upper byte write request signal /WEUB for prevention of current from passing through the initial stage of the upper byte data input buffers DinUBm. Further, the output statuses of the upper byte data input buffers DinUBm are set to a high impedance for protection of the data on the upper byte internal data bus DbusUB.

On the other hand, when the lower byte control signal /LB is set to non-selection at time t14, the lower byte write request signal WELB changes to the "L" level at time t15, and the lower byte write request signal /WELB changes to the "H" level at time t15, so that both the signals are disabled. As a result, the section write buffer SWBLB changes to the stand-by status. At the same time, the operation of the initial stage is disabled by the lower byte write request signal /WELB for prevention of current from passing through the initial stage of the lower byte data input buffers DinLBm. Further, the output statuses of the lower byte data input buffers DinLBm are set to a high impedance for protection of the data on the lower byte internal data bus DbusLB.

As described above, whenever the data are written in unit of byte, the upper byte control signal /UB and the lower byte control signal /LB both change independently in the same write cycle.

FIG. 7 shows an initial stage of the lower byte data input buffers DinLBn connected to the data input/output terminal I/OLBn. In the drawing, data inputted through the data input/output terminal I/OLBn is given to a NOR type gate NOR to which the lower byte write request signal /WELB is inputted.

In the circuit as shown in FIG. 5, the operation obtained when only the lower byte control signal /LB changes freely will be described hereinbelow with reference to a timing chart shown in FIG. 8. In FIG. 8, /WE denotes the write request signal /WE; /LB denotes the lower byte control signal /LB; WELB denotes an inversion signal WELB of the lower byte write request signal /WELB; /WELB denotes the lower byte write request signal /WELB; I/OLBn denotes the status of the data input/output terminals I/OLBn; φWS denotes the write start synchronous pulse φWS; φDTD denotes the data transition pulse φDTD; APD denotes the automatic power-down signal APD; DbusLB denotes the status of the internal data bus DbusLB; and dLB//dLBn denotes the lower byte data lines dLB and /dLB.

The operation obtained when the status of data inputted through the data input/output terminals I/OLBn changes at time t0 and thereby the write request signal /WE changes from the "H" level to the "L" level and after that the lower byte control signal /LB changes from the "H" level to the "L" level at time t1 is quite the same as before.

That is, when the write request signal /WE and the lower byte control signal /LB change from the "H" level to the "L" level, the lower byte write request signal WELB changes from the "H" level to the "L" level at time t2 and simultaneously the lower byte write request signal /WELB changes from the "L" level to the "H" level. As a result, through the NOR type gate NOR to which the lower byte write request signal /WELB is inputted, the data inputted through the data input/output terminal I/OLBn is inputted to the lower byte data input buffers DinLBn. At the same time, on the basis of the changed lower byte write request signal WELB, the output of the lower byte data input buffer DinLBn is set to a high impedance status. In other words, the input data status of the data input/output terminal I/OLBn is outputted to the lower byte internal data bus DbusLB at time t5.

On the other hand, in response to the change of the write request signal /WE, the write request signal detecting section WEdet outputs the "H" level write start synchronous pulse φWS for a predetermined time beginning at time t3. In the same way, in response to the change of data inputted to the lower byte data input buffers DinLBn, the data transition detecting circuit DTD outputs the "H" level data transition pulse φDTD for a predetermined time beginning at time t4. In response to this, the automatic power-down circuit APDbuffer keeps the automatic power-down signal APD at the "H" level for a predetermined time between time t6 and time t9, to maintain the device operation until the write operation ends.

As a result, at time t6, data are outputted from the lower byte data input buffers DinLBn to the internal data bus DbusLB, so that the data inputted to the data input/output put/out terminals I/OLBn are written in the selected cells ZLB in the same process as described before.

However, when the lower byte control signal /LB returns to the "H" level at time t8, the lower byte write request signals WELB and /WELB return to the "L" and "H" levels, respectively by following up the "H" level lower byte control signal /LB.

Here, the assumption is made that the automatic power-down signal APD returns from the "H" level to the "L" level into the automatic power-down mode again at time t10, and further the data inputted to the data input/output terminals I/OLBn are all set to the "H" level at time t11.

Under these conditions, when the write request signal /WE is at the "L" level and further the lower byte control signal /LB changes from the "H" level to the "L" level at time 12, the lower byte write request signals WELB and /WELB of the lower byte control buffer LBbuffer change to the "H" level and the "L" level, respectively at time t13.

As a result, the data inputted through the lower byte data input/output terminals I/OLBn are transmitted to the lower byte data input buffers DinLBn. However, as already explained, since the data inputted through the data input/output terminals I/OLBn are all at the "H" level, the internal statuses of the lower byte data input buffers DinLBn will not change, irrespective of the change of the lower byte write request signal /WELB. Therefore, the data transition detecting circuit DTD cannot generate the data transition pulse φDTD, so that it is impossible to release the automatic power-down status. In other words, it is impossible to write data, irrespective of that the lower byte control signal /LB is being enabled.

On the other hand, another timing chart as shown in FIG. 9 should be noted. In FIG. 9, /WE denotes the write request signal /WE; /LB denotes the lower byte control signal /LB; /UB denotes the upper byte control signal /UB; φWS denotes the write start synchronous pulse φWS; φWE denotes the write end synchronous pulse φWE; APD denotes the automatic power-down signal APD; φ/Eq denotes the equalize pulse φ/Eq; DbusUBm denotes status of upper byte internal data bus DbusUBm; and DbusLBn denotes the lower byte internal data bus DbusLBn.

Now, the assumption is made that the data inputted to the data input/output terminals I/OUB and I/OLB change and thereby the write request signal /WE changes from the "H" level to the "L" level at time t0; the upper byte control signal /UB and the lower byte control signal /LB change from the "H" level to the "L" level at time t2; and the address input does not change at all before and after the times t0 and t2.

In this case, as already explained, since the write request signal detecting section WEdet outputs the write start synchronous pulse φWS at time t2, in response to this pulse φWS the automatic power-down circuit APDbuffer changes the automatic power-down signal APD from the "L" level to the "H" level at time t3 to release the power-down.

As a result, the input data are transmitted to the internal data buses DbusUB, and DbusLB to write data in the memory.

On the other hand, when the upper byte control signal /UB changed from the "L" level to the "H" level at time t5; the lower byte control signal /LB changed from the "L" level to the "H" level at time t6; and the automatic power-down signal APD changed from the "H" level to the "L" level at time t7, the device enters into the power-down mode.

Under these conditions, the write request signal /WE is changed from the "L" level to the "H" level at time t8, and further the upper byte control signal /UB and the lower byte control signal /LB are both changed from the "H" level to the "L" level at time t10, to change the write mode to the read mode of the memory.

In this case, write request signal detecting section WEdet outputs the write end synchronous pulse φWE at time t11. Therefore, at time t10, the automatic power-down signal APD changes from the "L" level to the "H" level to release the power-down. At the same time, the equalizer circuit EQbuffer generates the equalize pulse φ/Eq to equalize/pull-up the data lines and the bus lines in the memory. On the basis of the signal APD and the pulse φ/Eq, the memory device operates in the same as in the ordinary address access read mode. Therefore, the address access time tACC is equal to the time between when the write request signal /WE changes and when data are outputted to the data input/output terminals I/OUBm and data input/output terminals I/OLBn.

On the other hand, the time between when the upper byte control signal /UB or the lower byte control signal /LB changes into the enable status and when data are outputted to the data input/output terminals I/OUBm or data input/output terminals I/OLBn is defined by the byte access time tUB or tLB. The byte access time tUB or tLB is the time required for outputting the read data (on the upper byte internal data bus DbusUB or the lower byte internal data bus DbusLB), to the data input/output terminals I/OUBm or the data input/output terminals I/OLBn (via the upper byte data output buffers DoutUBm or the lower byte output buffers DoutLBn), which is of course shorter than the address access time tACC. However, in the case of the byte access immediately after the write operation ends as shown in FIG. 9, it is impossible to assure the byte access times tUB or tLB, in spite of the fact that the address does not change. In other words, in FIG. 9, if t10−t8<tACC−tUB=tACC−tLB, a contradiction occurs with respect to the byte access time tUB or tLB. Therefore, a specific specification must be prepared for the countermeasures. However, this is impossible in practice.

In the conventional semiconductor memory device as described above, when data are required to be written in any required byte of a plurality of bytes, it is impossible to write data appropriately according to the data combination status, so that specific countermeasures are inevitably needed. Further, when the written data are required to be read as they are without changing the address, there exists a problem in that a contradiction occurs in the output data specification.

SUMMARY OF THE INVENTION

With these problems in mind, therefore, it is the object of the present invention to provide a semiconductor memory device of asynchronous type for controlling a plurality of bytes independently, by which the automatic power-down can be released in write mode even if the byte control signal changes freely in the write cycle; and further the data read of the written data can be ensured.

To achieve the above-mentioned object, the present invention provides a semiconductor memory device, comprising: a memory cell array composed of a plurality of memory cells in and from which data are written and read for each data group composed of a predetermined number of bits; and a control circuit responsive to data group control signals corresponding to each data group and a write request signal, for generating an internal synchronized pulse signal on the basis of a logical result of one of the data control signals and the write request signal, the internal synchronized pulse signal being synchronized with a write start time and a write end time and further enabling write operation of the data group corresponding to one of the data group control signals, write operation being controlled on the basis of the internal synchronized pulse signal.

Further, the present invention provides a semiconductor memory device, comprising: a plurality of input/output terminal groups through each of which a data group composed of a predetermined number of bits is inputted and outputted; a memory cell array having a plurality of memory cell groups to each of which a plurality of the data groups can be written and read individually; a plurality of buses for connecting each of said memory cell groups and each of said input/output terminal groups; a plurality of data group control signal input terminals provided in correspondence to each of said input/output terminal groups, for receiving data group control signals each having a select level for inputting and outputting data group through its own corresponding input/output terminal group and a nonselect level for inputting and outputting no data group; a write request signal input terminal for receiving a write request signal having a write enable level and a write disable level; and a control circuit responsive to a plurality of the data group control signals and the write request signal, for outputting a write start signal on the basis of a logical result of the select-level data group control signals and the enable-level write request signal, for writing the data group in the memory cell group through the input/output terminal group corresponding to the select-level data group control signal, and after that further controlling a write end signal in such a way that: when levels of the data group control signal related to the write operation and the write request signal both change to another level respectively, the write end signal is outputted to end the write operation; however, even if the write request signal level changes, when the data group control signal level does not change, the write end signal is not outputted.

The write request signal and a plurality of data group control signals are applied to the control circuit. The control circuit outputs the write start signal on the basis of a logical result of the write allowable level of the write request signal and a selected signal level of the data group control signals. After that, when the levels of these two signals change simultaneously, the write end signal is outputted. However, even if the level of the write request signal changes, when the signal level of the data group control signals do not change, the write end signal is not outputted. Therefore, immediately after that, the memory can read the written data group. In addition, the write request signal is used in common as the read request signal. That is, the write non-allowable level of the write request signal can operate the control circuit as the read request signal.

DETAILED DESCRIPTION OF THE PREFERRED EMBODIMENTS

Embodiments of the present invention will be described hereinbelow with reference to the attached drawings.

Figure 1:
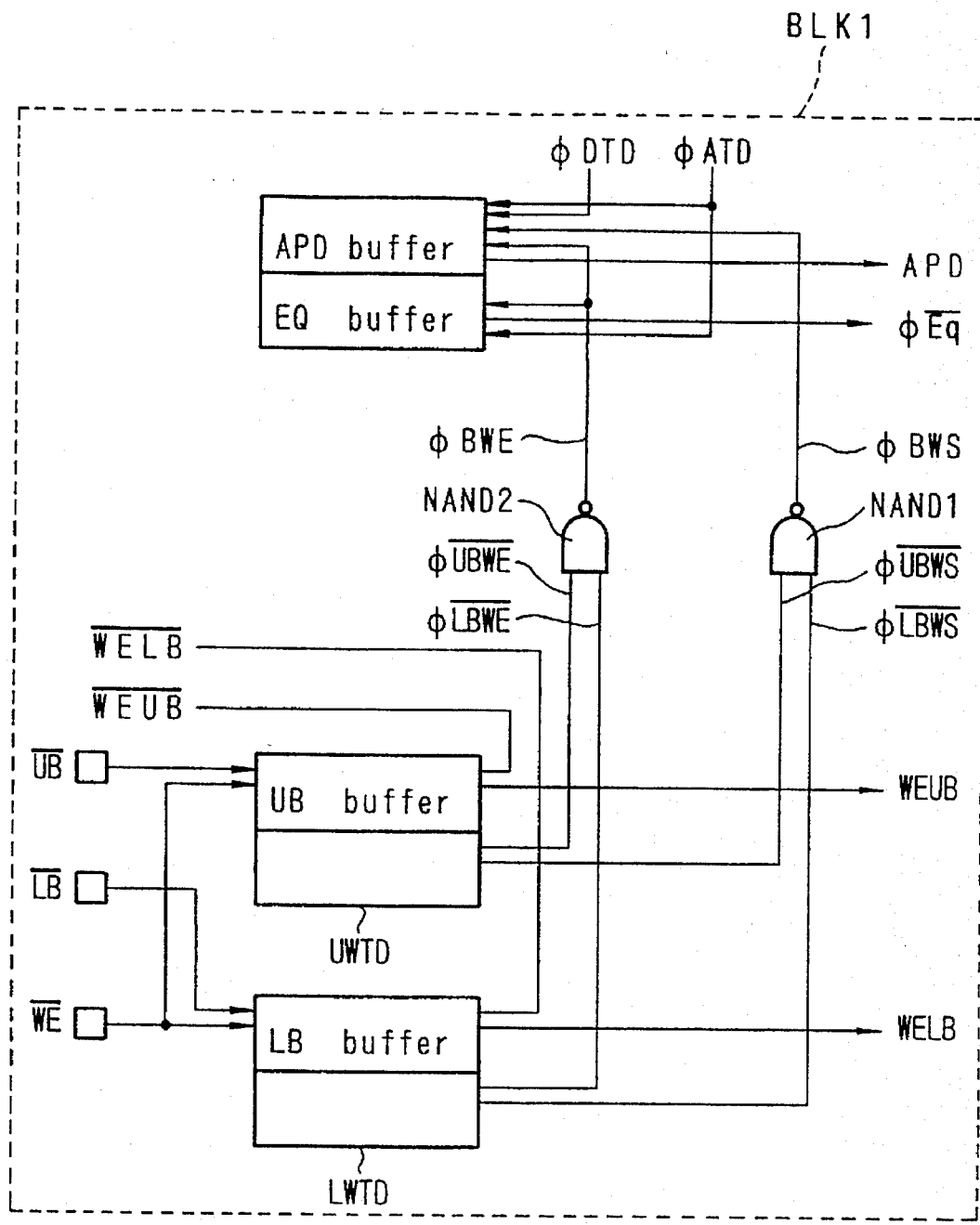
FIG. 1 is a partial block diagram showing a first embodiment of an essential portion of the semiconductor memory device according to the present invention.
Figure 1A:
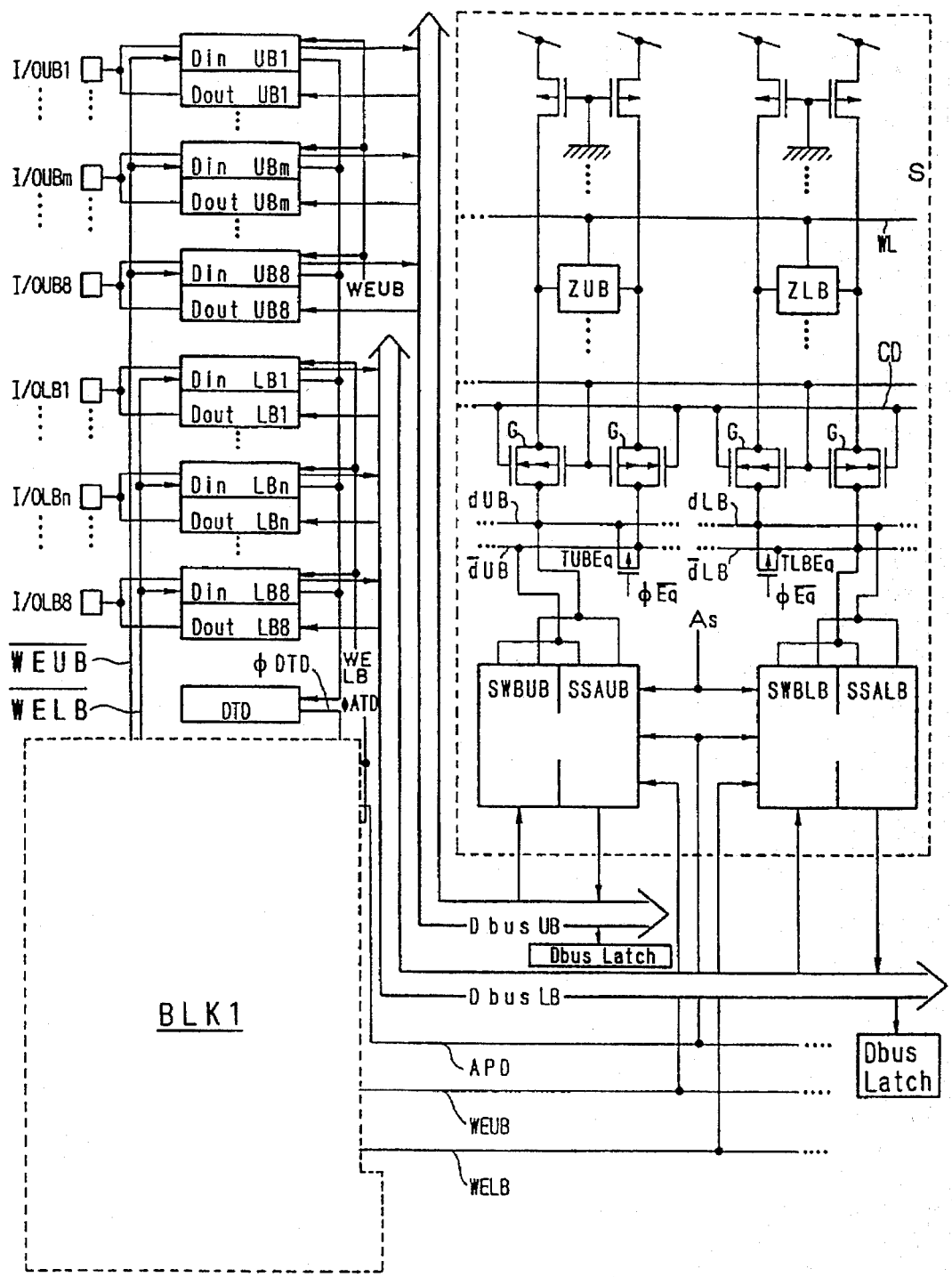
FIG. 1A is a block diagram showing the entire semiconductor memory device according to the present invention including the essential portion shown in FIG. 1.
Figure 5:
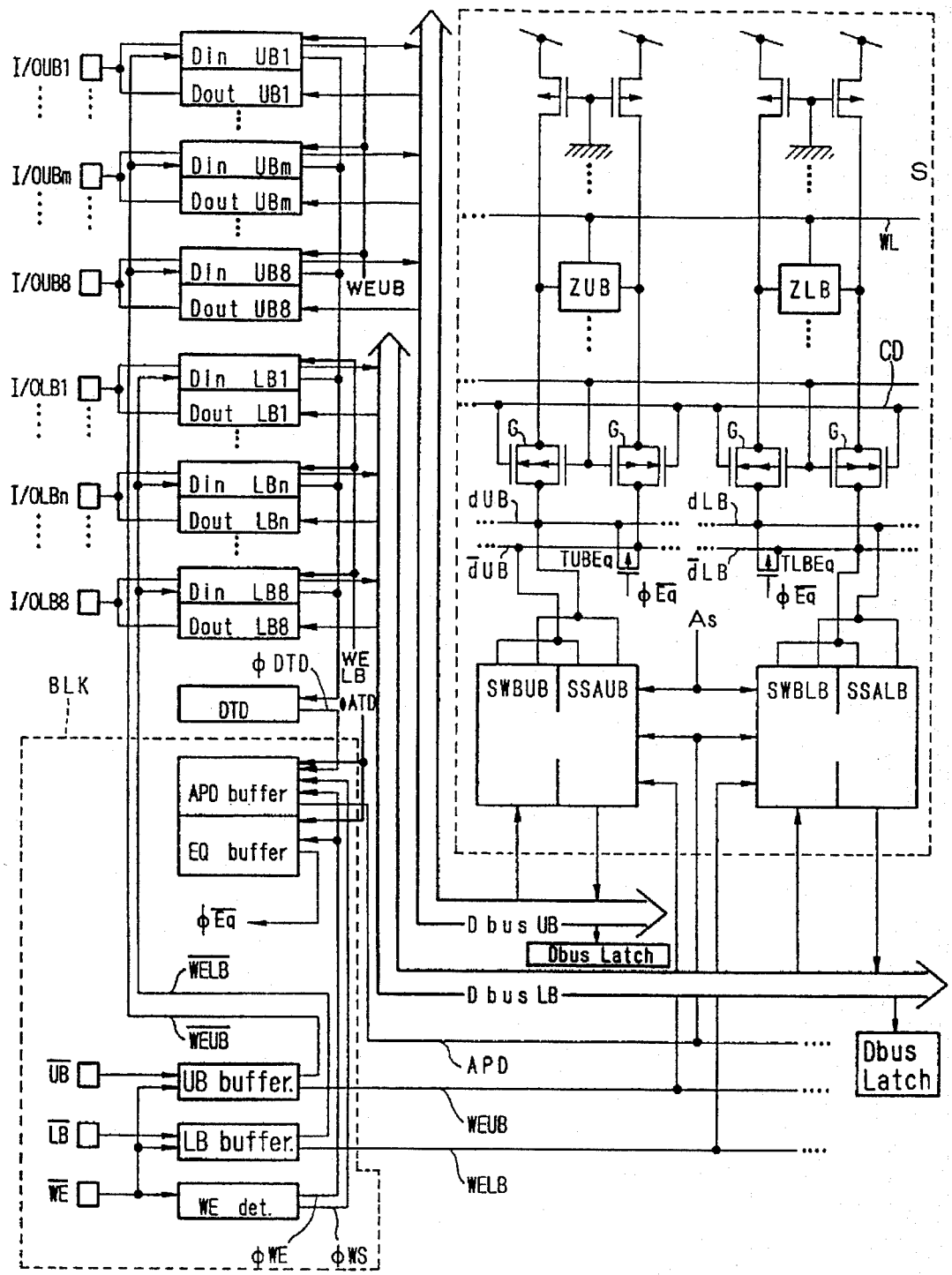
FIG. 5 is a block diagram showing the conventional semiconductor memory device.
Figure 6:
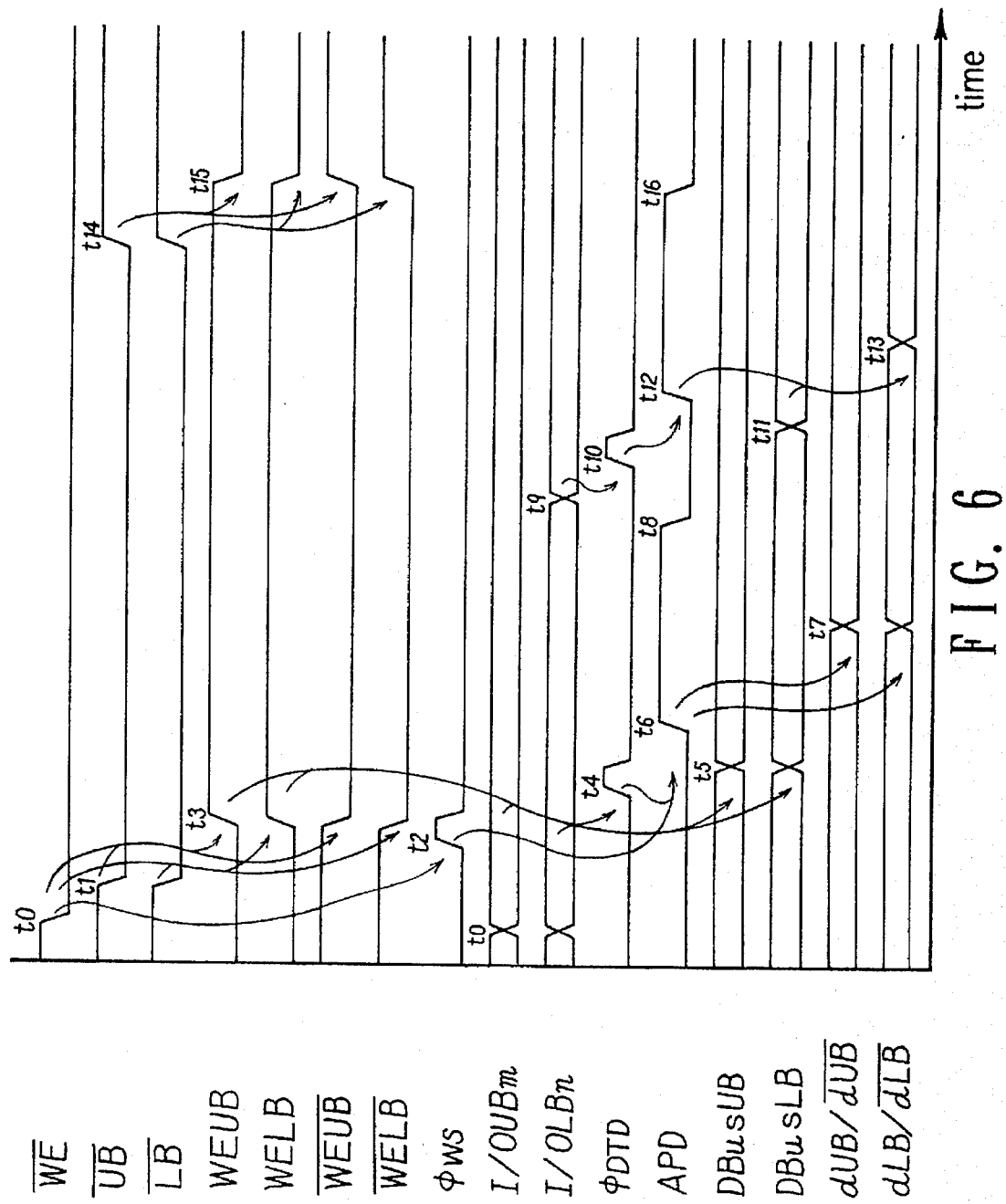
FIG. 6 is a timing chart for assistance in explaining the operation of the semiconductor memory device shown in FIG. 5.
Figure 7:
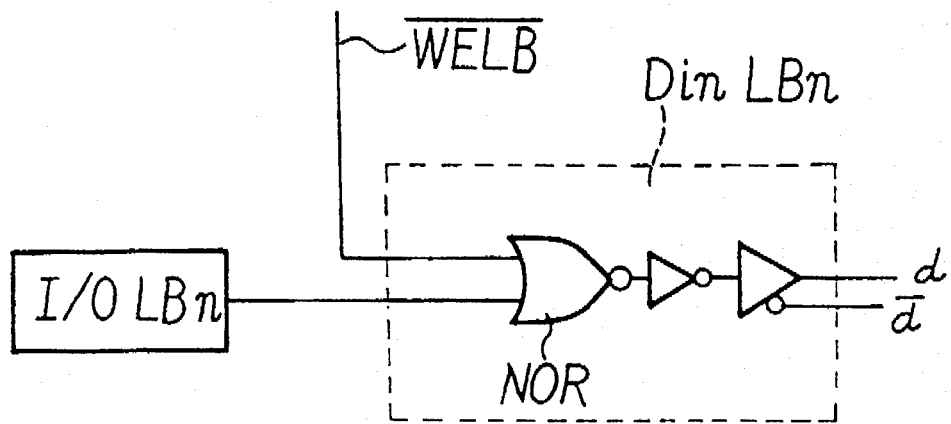
FIG. 7 is a block diagram showing an initial stage of the lower byte data input buffers DinLBm.

FIG. 1 shows a first embodiment of the semiconductor memory device according to the present invention, which corresponds to a block BLK shown in FIG. 5.

In FIG. 1, the upper byte control signal /UB is inputted to the upper byte control signal buffer UBbuffer; the lower byte control signal /LB is inputted to the lower byte control signal buffer LBbuffer; and the write request signal /WE is inputted to both the upper byte control signal buffer UBbuffer and the lower byte control signal buffer LBbuffer. Further, the upper byte control signal buffer UBbuffer is connected to a change detecting section UWTD for detecting changes of both the upper byte control signal /UB and the write request signal /WE, to generate the write start synchronous pulse $\phi$/UBWS and the write end synchronous pulse $\phi$/UBWE.

On the other hand, the lower byte control signal buffer LBbuffer is connected to a change detecting section LWTD for detecting changes of both the lower byte control signal /LB and the write request signal /WE, to generate the write start synchronous pulse $\phi$/LBWS and the write end synchronous pulse $\phi$/LBWE.

Further, the write end synchronous pulse $\phi$/UBWE of the change detecting section UWTD and the write end synchronous pulse /$\phi$LBWE of the change detecting section LWTD are both inputted to a NAND gate NAND2 to obtain a write end synchronous pulse $\phi$BWE on the basis of a logical result of the two signals $\phi$/UBWE and $\phi$/LBWE. The obtained write end synchronous pulse $\phi$BWE is given to the equalizer circuit EQbuffer and the automatic power-down circuit APD buffer. Here, since the write end synchronous pulse /$\phi$UBWE and the write end synchronous pulse /$\phi$LBWE are both usually at the "H" level, the write end synchronous pulse $\phi$BWE is at the "L" level (a negative logic pulse).

On the other hand, the write start synchronous pulse /$\phi$UBWS of the change detecting section LWTD and the write start synchronous pulse /$\phi$LBWS of the change detecting section LWTD are both inputted to a NAND gate NAND1 to obtain a write start synchronous pulse $\phi$BWS on the basis of a logical result of the two signals $\phi$/UBWS and $\phi$/LBWS. The obtained write start synchronous pulse $\phi$BWS is given to the automatic power-down circuit APD buffer. Here, since the write start synchronous pulse /$\phi$UBWS and the write start synchronous pulse /$\phi$LBWS are both usually at the "H" level, the write start synchronous pulse $\phi$BWS is at the "L" level (a negative logic pulse).

Figure 3:
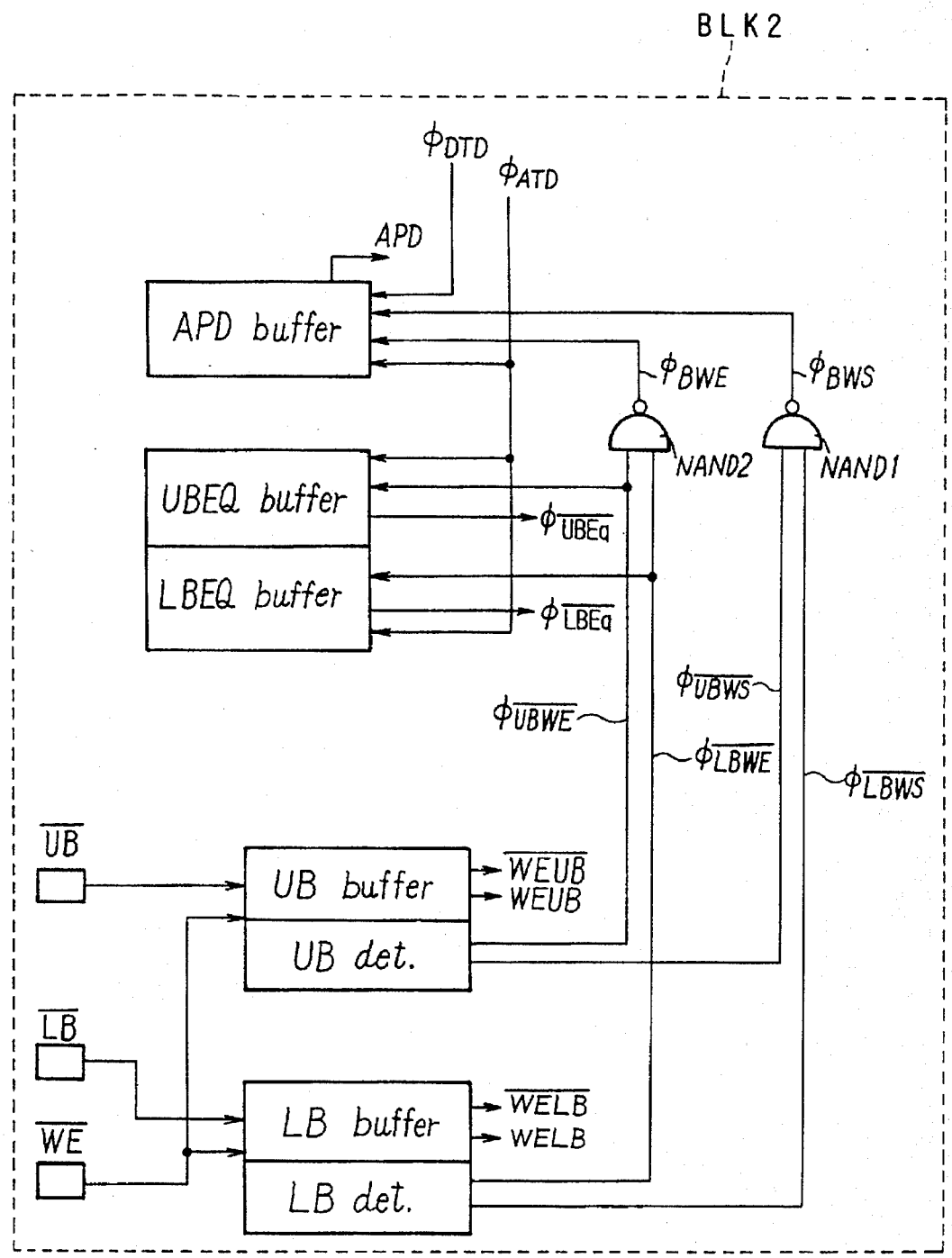
FIG. 3 is a partial block diagram showing a second embodiment of the essential portion of the semiconductor memory device according to the present invention.
Figure 3A:
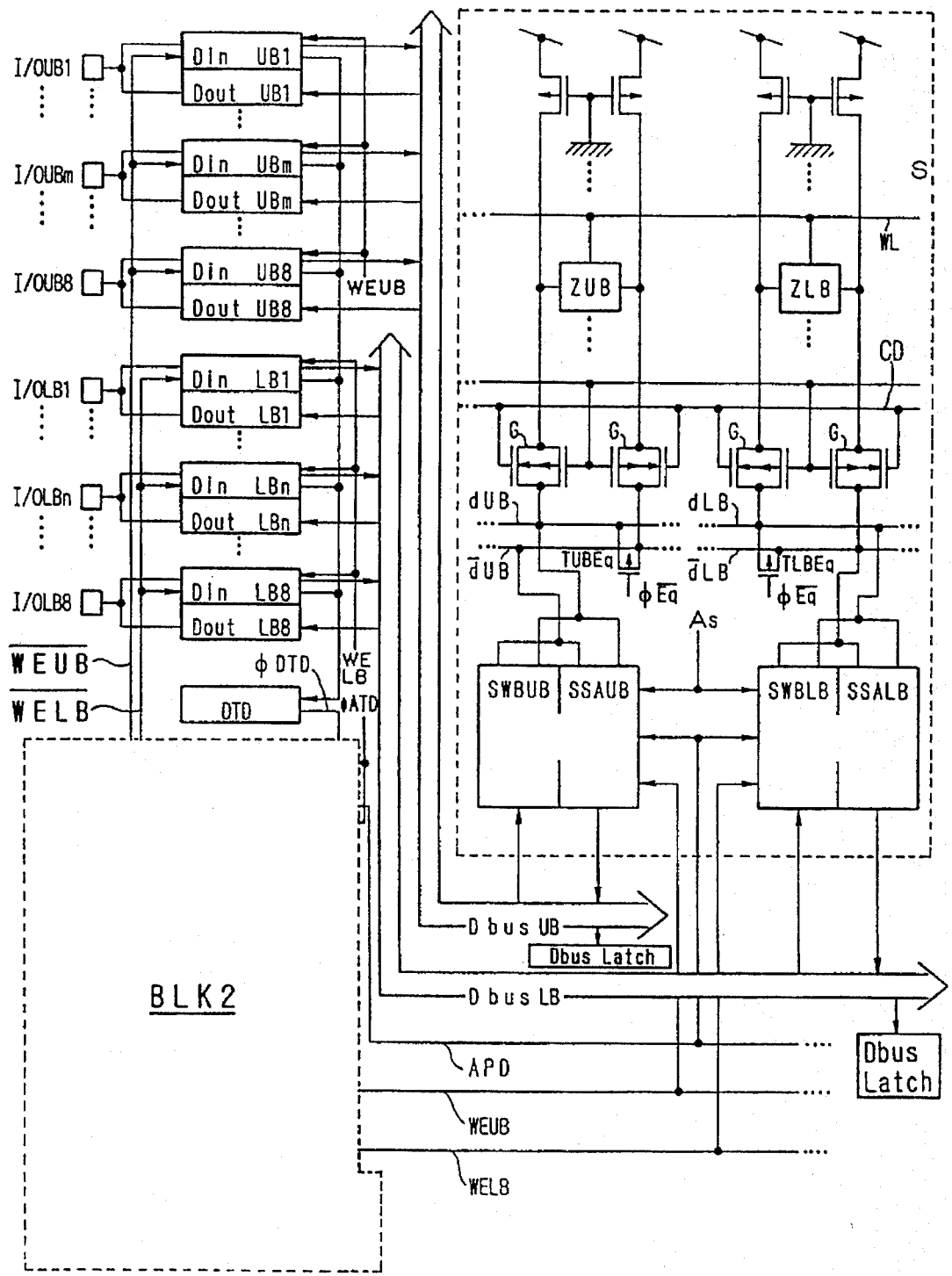
FIG. 3A is a block diagram showing the entire semiconductor memory device according to the present invention including the essential portion shown in FIG. 3.

FIG. 3 shows a second embodiment of the semiconductor memory device according to the present invention, which corresponds to a block BLK shown in FIG. 5. The second embodiment shown in FIG. 3 is different from the first embodiment shown in FIG. 1 only in the equalizer circuit EQbuffer.

In FIG. 3, the equalizer circuit EQbuffer is present in unit of byte. In more detail, an upper byte equalizer circuit UBEQbuffer inputs the upper bite write end synchronous pulse $\phi$/UBWE and the address transition pulse $\phi$ATD, and outputs an upper byte equalize pulse $\phi$/UBEq. The upper byte equalize pulse $\phi$/UBEq is applied to upper byte data line equalize/pull-up transistors including the data line equalize transistors TUBEq (shown in FIG. 5).

On the other hand, the lower byte equalizer circuit LBEQbuffer inputs the lower bite write end synchronous pulse $\phi$/LBWE and the address transition pulse $\phi$ATD, and outputs a lower byte equalize pulse $\phi$/LBEq. The lower byte equalize pulse $\phi$/LBEq is applied to lower byte data line equalize/pull-up transistors including the data line equalize transistors TLBEq (shown in FIG. 5).

The operation of the above-mentioned block BLK will be described hereinbelow with reference to the timing charts shown in FIGS. 2 and 4, respectively.

Figure 2:
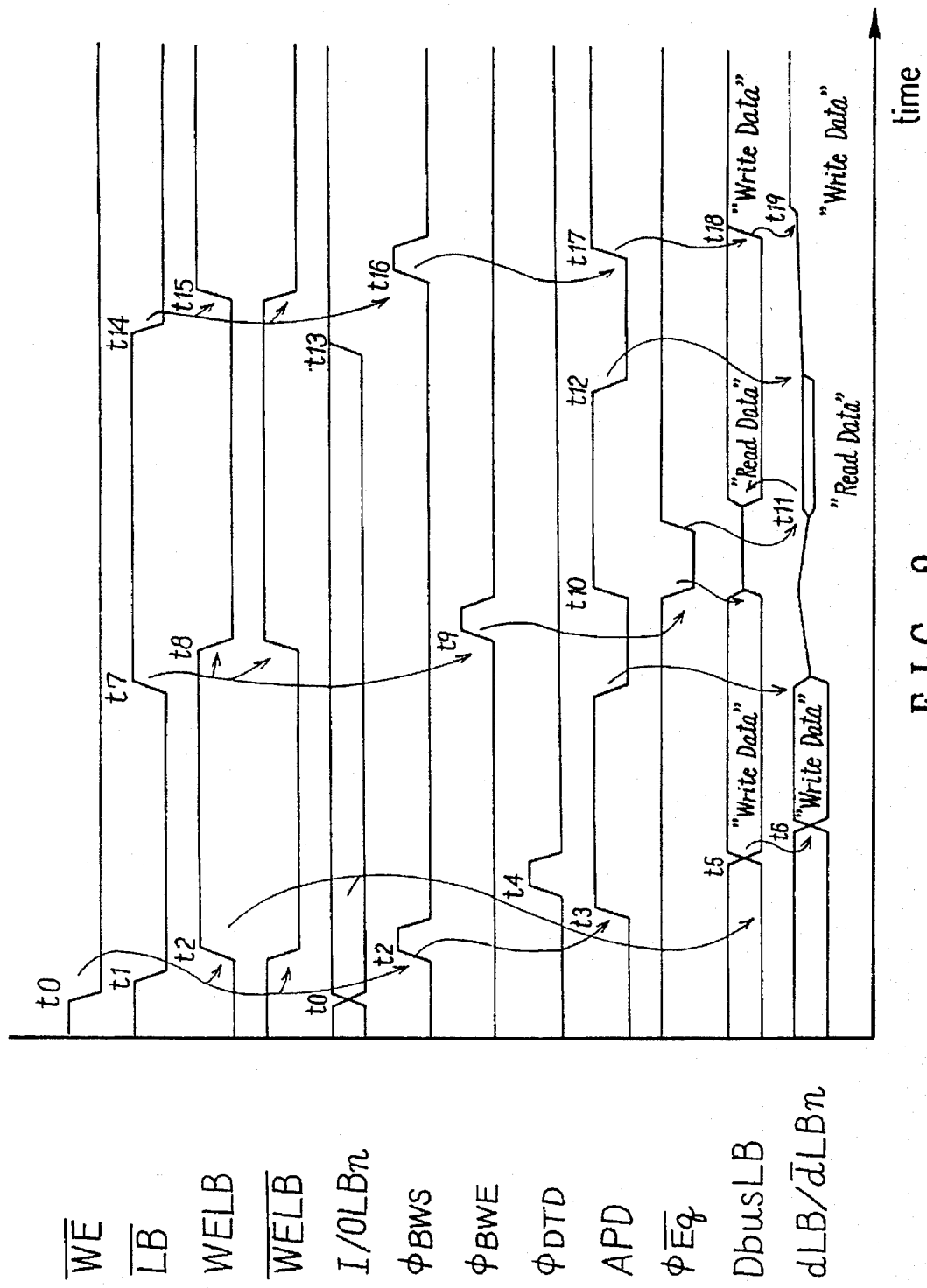
FIG. 2 is a timing chart for assistance in explaining the operation obtained when only the lower byte control signal /LB changes freely in the semiconductor memory device shown in FIG. 1.

FIG. 2 shows the level changes of the respective signals obtained when the lower byte control signal /LB is changed. In FIG. 2, /WE denotes the write request signal WE; /LB denotes the lower byte control signal /LB; WELB denotes an inversion signal WELB of the lower byte write request signal /WELB; /WELB denotes the lower byte write request signal /WELB; I/OLBn denotes the status of the data input/output terminals I/OLBn; $\phi$BWS denotes the write start synchronous pulse $\phi$BWS; $\phi$BWE denotes the write end synchronous pulse $\phi$BWE; $\phi$DTD denotes the data transition pulse $\phi$DTD; APD denotes the automatic power-down signal APD; $\phi$/Eq denotes the equalize pulse $\phi$/Eq; DbusLB denotes the status of the lower byte internal data bus DbusLB; and dLB//dLBn denotes the lower byte data lines dLB and /dLB.

Figure 4:
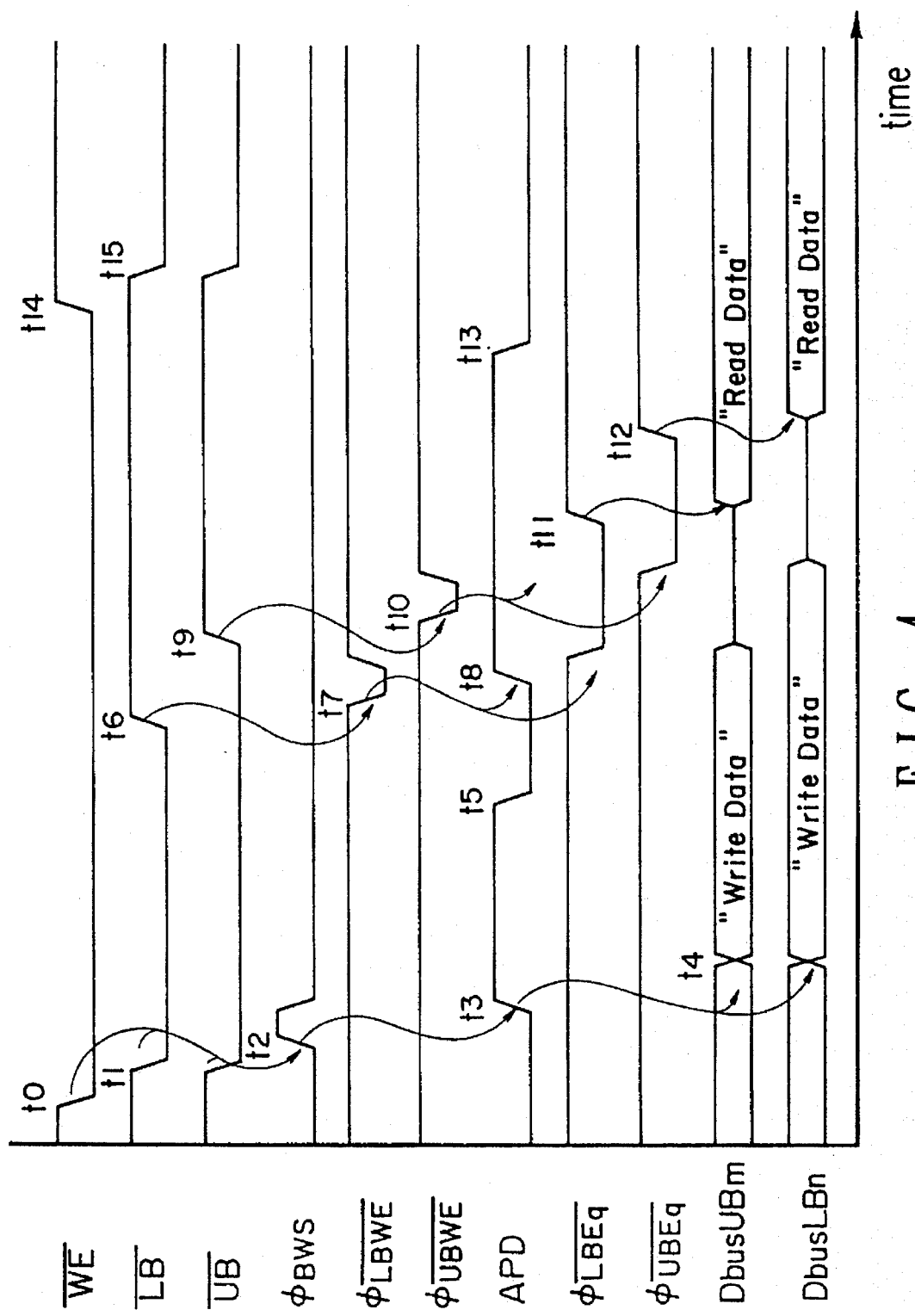
FIG. 4 is a timing chart for assistance in explaining the operation of the semiconductor memory device shown in FIG. 3.

On the other hand, FIG. 4 shows the level changes of the respective signals obtained when the write request signal /WE is changed. In FIG. 4, /WE denotes the write request signal /WE; /LB denotes the lower byte control signal /LB; /UB denotes the upper byte control signal /UB; $\phi$BWS denotes the write start synchronous pulse $\phi$BWS; $\phi$/LBWE denotes the lower byte write end synchronous pulse φ/LBWE; φ/UBWE denotes the upper byte write end synchronous pulse φ/UBWE; APD denotes the automatic power-down signal APD; φ/LBEq denotes the lower byte equalize pulse φ/LBEq; φ/UBEq denotes the upper byte equalize pulse φ/UBEq; DbusUBm denotes the status of the upper byte internal data bus DbusUBm; and DbusLBn denotes the status of the lower byte internal data bus DbusLBn.

The operation obtained when only the lower byte control signal /LB is changed will be described hereinbelow with reference to FIG. 2.

Here, the assumption is made that the status of data inputted to the data input/output terminals I/OLBn changes at time t0 so that the write request signal /WE changes from the "H" level to the "L" level; and further the lower byte control signal /LB changes from the "H" level to the "L" level at time t1.

In this case, since the write request signal /WE and the lower byte control signal /LB change from the "H" level to the "L" level, the lower byte write request signal WELB changes from the "L" level to the "H" level at time t3 and further the lower byte write request signal /WELB changes from the "H" level to the "L" level at time t3.

On the other hand, since the write request signal /WE and the lower byte control signal /LB both change, the lower byte write start synchronous pulse φ/LBWS of a negative logic pulse is inputted to the NAND gate NAND1, so that the NAND gate NAND1 outputs the write start synchronous pulse φBWS at time t2 to the automatic power-down circuit APDbuffer.

Further, since the level of the lower byte write request signal /WELB changes, the data of the data input/output terminals I/OLBn are inputted to the lower byte data input buffers DinLBn. At this time, as far as the levels of all the data on the data input/output terminals I/OLBn are not at the "H" level, the data transition detecting circuit DTD detects the change in the level of the input data and generates a data transition pulse φDTD.

In response to any advanced one of the write start synchronous pulse φBWS and the data transition pulse φDTD, the automatic power-down circuit APDbuffer releases the automatic power-down for a predetermined time at time t3.

Figure 8:
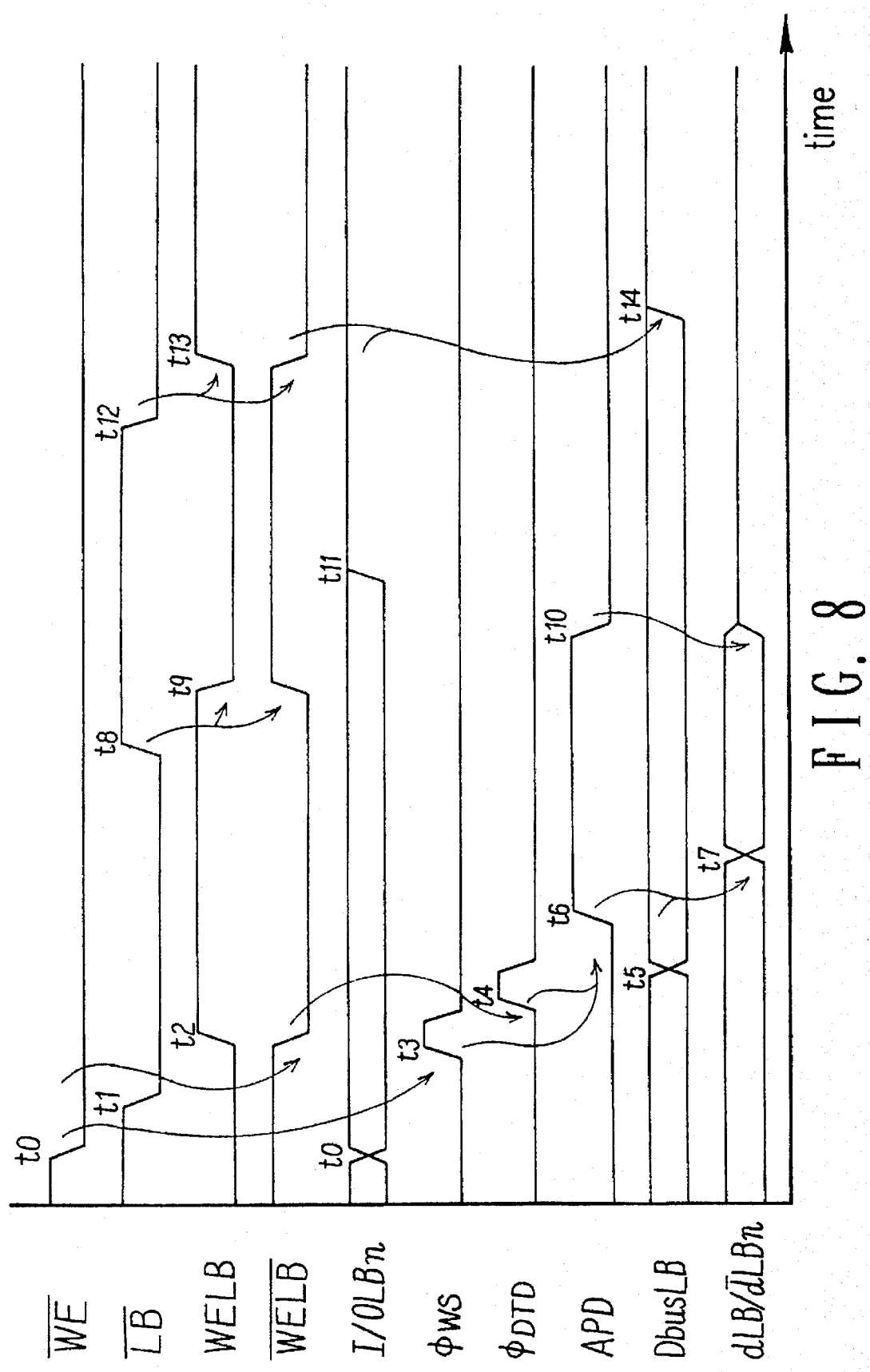
FIG. 8 is a timing chart for assistance in explaining the operation obtained when only the lower byte control signal /LB changes freely in the conventional semiconductor memory device shown in FIG. 5.
Figure 9:
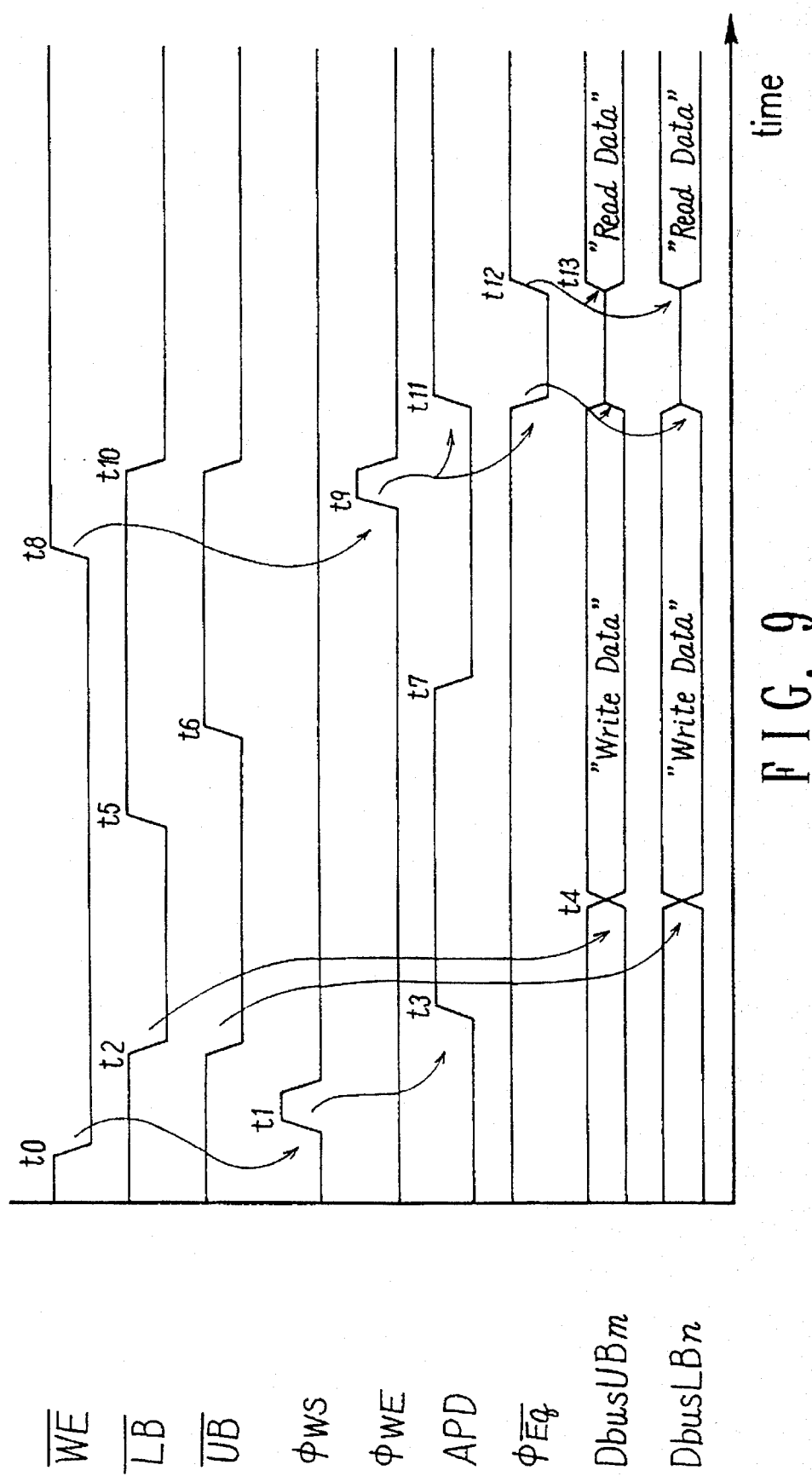
FIG. 9 is a timing chart for assistance in explaining the operation obtained when the write request signal /WE changes in the conventional semiconductor memory device shown in FIG. 5.

In the same way as with the operation shown in FIG. 8, in response to the changes of the lower byte write request signals WELB and /WELB, the lower byte data input buffers DinLBn output the data statuses of the data input/output terminals I/OLBn to the lower byte internal bus DbusLB at time t5. Therefore, the automatic power-down of the section S selected by the address signal As is released. Further, through the section write buffer SWBLB of the section S activated by the lower byte write request signal WELB, the statuses of the lower byte internal data bus DbusLB are given to the lower byte data lines dLB and /dLB at time t6. As a result, the statuses of the data are written in the selected memory cells ZLB.

In this case, however, since the lower byte control signal /LB returns to the "H" level at time t7, consequently the lower byte write request signal WELB is returned to the "L" level and the lower byte write request signal /WELB is returned to the "H" level at time t8.

At the same time, the lower byte write end synchronous pulse φ/LBWE is outputted, so that the write end synchronous pulse φBWE is outputted by the NAND2 at time t9. The outputted pulse φBWE is applied to the automatic power-down circuit APDbuffer and the equalizer circuit EQbuffer.

In response to this pulse φBWE, the automatic power-down buffer APDbuffer keeps the automatic power-down signal APD at the "H" level between time t10 and t12. At the same time, the equalizer circuit EQbuffer generates the data line equalize signal EQ between time t10 and time t11 for data line equalization.

However, since the lower byte write request signal WELB is at the "L" level, the lower byte data input buffers DinLBn are not activated, so that the status of the lower byte internal data bus DbusLB is held by the lower byte internal data bus latch circuit LBlatch. In the same way as above, although the section write buffer SWBLB is not activated, since the automatic power-down signal APD is released, the selection memory cells ZLB are set to the read mode. Accordingly, the read data develop on the lower byte data lines dLB and /dLB, after the equalize signal EQ is returned to the "H" level at time t11 and until the automatic power-down signal APD changes to the "L" level.

After the device has been set to the automatic power-down mode after t12, all the data of the data input/output terminals I/OLBn are set to the "H" level at time t13. At this time, however, since the lower byte write request signals WELB and /WELB are set to the disable status, the internal circuits are kept unchanged.

After that, the lower byte control signal /LB changes from the "H" level to the "L" level at time t14. As a result, the lower byte write request signal WELB changes to the "H" level at time t15, and at the same time the lower byte write request signal /WELB returns to the "L" level. Therefore, all the "H" level data of the data input/output terminals I/OLBn are transmitted to the lower byte data input buffers DinLBn. In this case, however, since the data will not change from the internal circuit point of view, the data transition detecting circuit DTD does not generates the data transition pulse φDTD. Further, the outputs of the lower byte data input buffers DinLBn, that is, all the I/O statuses of the lower byte internal data bus DbusLB are set to the "H" level data at time t18.

However, in response to the change of the lower byte control signal /LB, the write start synchronous pulse φBWS is outputted by the NAND1 at time t16. In response to this signal φBWS, the automatic power-down circuit APDbuffer releases the automatic power-down at time t17. As a result, the automatic power-down of the selection S selected by the address signal As is released.

Further, through the section write buffer SWBLB of the section S activated by the lower byte write request signal WELB, all the "H" level data statuses of the lower byte internal data bus DbusLB are given to the lower byte data lines dLB and /dLB at time t19. As a result, the statuses of the data are written in the selected memory cells ZLB.

That is, it is possible to write data in the memory without causing any problems, even when only the lower byte control signal /LB is controlled independently. The same can be applied to the case where the only the upper byte control signal /UB is controlled independently.

The operation obtained when the write request signal /WE changes will be described hereinbelow.

Now, the assumption is made that at time t0 data on the data input/output terminal I/OLB change so that the write request signal /WE changes from the "H" level to the "L" level. On the other hand, at time t1, the upper byte control signal /UB changes from the "H" level to the "L" level.

In this case, in response to the changes of the write request signal /WE and the upper byte control signal /UB, the change detecting section UWTD outputs the write start synchronous pulse φ/UBWS.

On the other hand, in response to the changes of the write request signal /WE and the lower byte control signal /LB, the change detecting section LWTD outputs the write start synchronous pulse φ/LBWS. These signals are inputted to the NAND1, so that the NAND1 outputs the write start synchronous pulse φBWS at time t2.

As a result, the automatic power-down circuit APDbuffer keeps the automatic power-down signal APD at the "H" level for a predetermined time between time t3 and time t5. Further, at time t4, the data inputted through the data input/output terminals I/OUBm and the data input/output terminals I/OLBn are transmitted to the upper byte internal data bus DbusUB and the lower byte internal data bus DbusLB via the upper byte data input buffers DinUBm and the lower byte data input buffers DinLBn, respectively, so that the data are written in the selected memory cells ZUB and ZLB.

On the other hand, at time t6, when the lower byte control signal /LB returns from the "L" level to the "H" level, since the input change can be detected by the change detecting section LWTD, the lower byte write end synchronous pulse φ/LBWE is outputted. As a result, the lower byte equalizer circuit LBEQbuffer outputs the lower byte equalize pulse φ/LBEq at time t7. At the same time, the write end pulse φBWE is outputted again from the NAND2. In response to this write end pulse φBWE, the automatic power-down circuit APDbuffer keeps the automatic power-down signal APD at the "H" level for a predetermined time beginning at time t8.

Further, at time t9, when the upper byte control signal /UB returns from the "L" level to the "H" level, since the input change can be detected by the change detecting section UWTD, the upper byte write end synchronous pulse φ/UBWE is outputted. As a result, the upper byte equalizer circuit UBEQbuffer outputs the upper byte equalize pulse φ/UBEq at time t7. At the same time, the write end pulse φBWE is outputted again from the NAND2. In response to this write end pulse φBWE, the automatic power-down circuit APDbuffer is reset again to keep the automatic power-down signal APD at the "H" level for a predetermined time to time t13.

At this time, in response to the change of the lower byte control signal /LB, the lower byte write request signal WELB changes, so that the section write buffer SWBLB is set to a stand-by status. At the same time, the section sense amplifier SSALB is activated. Therefore, when the lower byte equalize pulse φ/LBEq ends at time t11, data stored in the select memory cells ZLB are outputted to the lower byte internal bus DbusLB.

On the other hand, in response to the change of the upper byte control signal /UB, the upper byte write request signal WEUB changes, so that the section write buffer SWBUB is set to a stand-by status. At the same time, the section sense amplifier SSAUB is activated. Therefore, when the upper byte equalize pulse φ/UBEq ends at time t12, data stored in the select memory cells ZUB are outputted to the upper byte internal bus DbusUB.

After that, at time t13, when the automatic power-down signal APD changes to the "L" level, the device is set to the power-down mode.

Under these conditions, when the write request signal /WE is changed from the "L" level to the "H" level at time t14 and further the upper byte control signal /UB and the lower byte control signal /LB are changed from the "H" level to the "L" level at time t15, the memory device is changed from the write mode to the read mode.

In this case, even if the write request signal /WE is changed from the "L" level to the "H" level, since the upper byte control signal /UB and the lower byte control signal /LB will not change, the change detecting sections UWTD and LWTD do not output the write end synchronous pulse φUBWE and the write end synchronous pulse φ/LBWE, so that write end synchronous pulse φBWE is not outputted.

Consequently, the correct data already read to the internal data buses DbusUB and DbusLB can be read immediately. In other words, the written data can be read, as they are, without changing the addresses, in quite the same way as with the ordinary operation without changing the specification to a specific one.

Further, in the above-mentioned embodiments, the write start synchronous pulse φBWS and the write end synchronous pulse φBWE are generated by use of the change detecting sections UWTD and LWTD. Without being limited thereto, however, it is also possible to use any circuits as far as the changes of the write request signal /WE, the upper byte control signal /UB and the lower byte control signal /LB can be associated with the write start synchronous pulse φBWS and the write end synchronous pulse φBWE, on the basis of specific logical conditions.

Further, in the above-mentioned embodiments, although the data are divided into two of upper and lower bytes, it is of course possible to apply the present invention to the memory device by which data composed of multi-bytes are accessed.

As described above, in the semiconductor memory device according to the present invention by which a plurality of data are accessed in unit of byte, when data are transferred from the input/output terminals I/OUBm and I/OLBn to the internal data buses DbusUB and DbusLB through the upper byte data input buffers DinLBm and the lower byte input buffers DinLBn or when data are transferred from the memory cells to the internal data buses DbusUB and DbusLB, the change detecting sections UWTD and LWTD can control the data write and read to and from the memory cells, by generating the write start synchronous pulse φBWS and the write end synchronous pulse φBWE, on the basis of the logical result of the write request signal /WE (for controlling data write and read) and the upper byte control signal /UB or the lower byte control signal /LB (for designating and selecting data bytes). Therefore, when the data are written and read for each byte independently, data can be written in and read from the memory cells, irrespective of the data conditions. Further, it is possible to control the memory device in such a way that written data can be read immediately, without changing the addresses, As described above, in the semiconductor memory device according to the present invention, since the write operation is executed on the basis of the logical result of the control signal (for selecting the input/output terminal group through which data are written) and the write request signal, the write operation can be secured. Further, when the control signal level is kept unchanged at the write end, since no write end signal is outputted, it is possible to read the written data immediately after data have been written.

What is claimed is:

1. A semiconductor memory device comprising:
   a memory cell array composed of a plurality of memory cells in and from which data are written and read for data groups, each of the data groups having a plurality of bits, data being written during a write operation and data being read during a read operation; and
   a control circuit for obtaining a result of a logical operation on the basis of a write request signal and control signals for at least one of the data groups to generate an internal synchronized pulse signal to control the write operation, wherein the internal synchronized pulse signal is synchronized with a write start time and a write end time.

2. The semiconductor memory device of claim 1, wherein the internal synchronized pulse signal output by said control circuit includes a write start signal synchronized with the write start time and a write end signal synchronized with the write end time.

3. The semiconductor memory device of claim 1, wherein said control circuit also controls the read operation.

4. The semiconductor memory device of claim 3, wherein said control circuit uses the write request signal in common for both writing and reading data, the write operation being executed when the write request signal is at a write level and the read operation being executed when the write request signal is at a read level.

5. A semiconductor memory device comprising:

a memory cell array composed of a plurality of memory cells in and from which data are written and read for data groups, each of the data groups having a predetermined number of bits; and a control circuit responsive to data group control signals corresponding to each of the data groups and a write request signal, for generating an internal synchronized pulse signal on the basis of a logical result of one of the data control signals and the write request signal, the internal synchronized pulse signal being synchronized with a write start time and a write end time and further enabling write operation of the data group corresponding to one of the data group control signals, write operation being controlled on the basis of the internal synchronized pulse signal, wherein the internal synchronized pulse signal output by said control circuit includes a write start signal and a write end signal, and said control circuit outputs the write start signal when one of the data group control signals is at a select level and further the write request signal is at the write level, and thereafter outputs the write end signal when one of the data group control signals changes to a non-select level and further the write request signal changes to another level; however, even if the write request signal level changes, when a level of one of the data group control signals does not change, the write end signal is not outputted.

6. A semiconductor memory device comprising:

a memory cell array composed of a plurality of memory cells in and from which data are written and read for data groups, each of the data groups having a predetermined number of bits; and a control circuit responsive to data group control signals corresponding to each of the data group and a write request signal, for generating an internal synchronized pulse signal on the basis of a logical result of one of the data control signals and the write request signal, the internal synchronized pulse signal being synchronized with a write start time and a write end time and further enabling write operation of the data group corresponding to one of the data group control signals, write operation being controlled on the basis of the internal synchronized pulse signal, wherein the internal synchronized pulse signal output by said control circuit includes a write start signal and a write end signal, said control circuit also controls read operation, said control circuit uses the write request signal in common for both writing and reading data, write operation being executed when the write request signal is at a write level and read operation being executed when the write request signal is at a read level, and said control circuit outputs the write start signal when one of the data group control signals is at a select level and further the write request signal is at the write level, and thereafter outputs the write end signal when one of the data group control signals changes to a non-select level and further the write request signal changes to another level; however, even if the write request signal level changes, when a level of one of the data group control signals does not change, the write end signal is not outputted.

7. The semiconductor memory device of claim 5, which further comprises an automatic power-down circuit responsive to the write end signal, for stopping memory device operation for power saving.

8. The semiconductor memory device of claim 6, which further comprises an automatic power-down circuit responsive to the write end signal, for stopping memory device operation for power saving.

9. The semiconductor memory device of claim 7, wherein complementary data are inputted to and outputted from each of the memory cells, and data are transferred between the memory cells through complementary data lines.

10. The semiconductor memory device of claim 8, wherein complementary data are inputted to and outputted from each of the memory cells, and data are transferred between the memory cells through complementary data lines.

11. The semiconductor memory device of claim 9, which further comprises an equalize circuit for conducting the complementary data lines whenever an address changes.

12. The semiconductor memory device of claim 10, which further comprises an equalize circuit for conducting the complementary data lines whenever an address changes.

13. The semiconductor memory device of claim 9, wherein said memory cell array is divided into a plurality of memory blocks each composed of a plurality of memory cells, the memory blocks having mutually parallel arranged data inputting/outputting paths, the complementary data lines being provided for each memory block.

14. The semiconductor memory device of claim 10, wherein said memory cell array is divided into a plurality of memory blocks each composed of a plurality of memory cells, the memory blocks having mutually parallel arranged data inputting/outputting paths, the complementary data lines being provided for each memory block.

15. The semiconductor memory device of claim 13, wherein an equalize circuit for conducting the complementary data lines whenever an address changes is provided for each of the memory block, independently.

16. The semiconductor memory device of claim 14, wherein an equalize circuit for conducting the complementary data lines whenever an address changes is provided for each of the memory block, independently.

17. A semiconductor memory device, comprising:

a plurality of input/output terminal groups through each of which a data group composed of a predetermined number of bits is inputted and outputted;

a memory cell array having a plurality of memory cell groups to each of which a plurality of the data groups can be written and read individually;

a plurality of buses for connecting each of said memory cell groups and each of said input/output terminal groups;

a plurality of data group control signal input terminals provided in correspondence to each of said input/output terminal groups, for receiving data group control signals each having a select level for inputting and outputting data group through its own corresponding input/output terminal group and a non-select level for inputting and outputting no data group;

a write request signal input terminal for receiving a write request signal having a write enable level and a write disable level; and a control circuit responsive to a plurality of the data group control signals and the write request signal, for outputting a write start signal on the basis of a logical result of the select-level data group control signals and the enable-level write request signal, for writing the data group in the memory cell group through the input/output terminal group corresponding to the select-level data group control signal, and after that further controlling a write end signal in such a way that: when levels of the data group control signal related to the write operation and the write request signal both change to another level respectively, the write end signal is outputted to end the write operation; however, even if the write request signal level changes, when the data group control signal level does not change, the write end signal is not outputted.

18. The semiconductor memory device of claim 17, wherein said control circuit is so constructed as to execute read operation when the write request signal is at the write disable level, and executes data group read operation through the input/output terminal group selected by the select-level data group control signal on the basis of a logical result of the disable-level write request signal and the select-level data group control signals.

19. A semiconductor memory device comprising:

a memory cell array composed of a plurality of memory cells to and from which data are written and read by data groups, data being written during a write operation and data being read during a read operation; and a control circuit for obtaining a result of a logical operation on the basis of a write request signal and control signals for at least one of the data groups, to generate an internal synchronized pulse signal to control the write operation, wherein each of the data groups are composed of a plurality of bytes, and the internal synchronized pulse signal is synchronized with a write start time and a write end time.

20. The semiconductor memory device of claim 19, wherein the control circuit also controls the read operation.

21. The semiconductor memory device of claim 20, wherein the control circuit uses the write request signal in common for both writing and reading data, the write operation being executed when the write request signal is at a write level and the read operation being executed when the write request signal is at a read level.

22. The semiconductor memory device of claim 19, wherein the internal synchronized pulse signal output by the control circuit includes a write start signal synchronized with the write start time and a write end signal synchronized with the write end time.

23. The semiconductor memory device of claim 22, wherein the control circuit outputs the write start signal when one of the data group control signals is at a select level and further the write request signal is at the write level, and thereafter outputs the write end signal when one of the data group control signals changes to a non-select level and further the write request signal changes to another level; however, even if the write request signal level changes, when a level of one of the data group control signals does not change, the write end signal is not output.

24. The semiconductor memory device of claim 23, further comprising an automatic power-down circuit responsive to the write end signal, for stopping memory device operation to save power.

25. The semiconductor memory device of claim 23, wherein the memory cell array is divided into a plurality of memory blocks each composed of a plurality of memory cells, the memory blocks having mutually parallel arranged data inputting/outputting paths.

* * * * *